United States Patent
Serizawa et al.

(10) Patent No.: US 7,966,167 B2
(45) Date of Patent: Jun. 21, 2011

(54) SUPPORT METHOD, DESIGN SUPPORT APPARATUS, AND STORAGE MEDIUM

(75) Inventors: Masahiro Serizawa, Toride (JP); Akira Morisawa, Kashiwa (JP); Hideyuki Ikegami, Abiko (JP); Toru Ono, Toyota (JP)

(73) Assignee: Canon Kabushiki Kaisha, Tokyo (JP)

( * ) Notice: Subject to any disclaimer, the term of this patent is extended or adjusted under 35 U.S.C. 154(b) by 904 days.

(21) Appl. No.: 11/850,246

(22) Filed: Sep. 5, 2007

(65) Prior Publication Data

US 2008/0065367 A1    Mar. 13, 2008

(30) Foreign Application Priority Data

Sep. 8, 2006    (JP) ................................. 2006-244826

(51) Int. Cl.
B65H 5/22    (2006.01)
(52) U.S. Cl. ........................................ 703/13; 271/4.09
(58) Field of Classification Search .................. 703/6, 7, 703/13; 271/3.06, 3.09, 4.06, 4.09; 399/15, 399/18, 21, 31, 68, 162, 312, 388
See application file for complete search history.

(56) References Cited

U.S. PATENT DOCUMENTS

| | | | |
|---|---|---|---|
| 5,844,819 A | 12/1998 | Fujinuma | 364/578 |
| 5,999,757 A * | 12/1999 | Shimomura et al. | 399/9 |
| 2005/0082737 A1 | 4/2005 | Sasaki et al. | 271/9.12 |
| 2006/0159499 A1 | 7/2006 | Watanabe et al. | 399/391 |
| 2006/0165442 A1 * | 7/2006 | Kobayashi et al. | 399/301 |
| 2006/0220305 A1 | 10/2006 | Serizawa et al. | 271/262 |
| 2010/0158584 A1 * | 6/2010 | Ueno et al. | 399/313 |

FOREIGN PATENT DOCUMENTS

| | | |
|---|---|---|
| JP | 5-143260 | 6/1993 |
| JP | 9-81600 | 3/1997 |

* cited by examiner

*Primary Examiner* — Paul L Rodriguez
*Assistant Examiner* — Andre Pierre Louis
(74) *Attorney, Agent, or Firm* — Fitzpatrick, Cella, Harper & Scinto (57) ABSTRACT

A design support method of inspecting control on an image forming apparatus based on a simulation result of operation control on a virtual device which is modeled to simulate operation of the image forming apparatus includes the steps of referring to control definition information for determining whether an operation request is proper with respect to a virtual device for which the operation request is input, in accordance with an operating state of the virtual device, and determining, based on the control definition information referred to in the referring step whether operation of the virtual device can be performed.

5 Claims, 6 Drawing Sheets

SUPPORT METHOD, DESIGN SUPPORT APPARATUS, AND STORAGE MEDIUM

BACKGROUND OF THE INVENTION

1. Field of the Invention

The present invention relates to a design support technique for an image forming apparatus.

2. Description of the Related Art

Software controls mechanisms constituting an image forming apparatus. For example, when conveying a recording member by using a conveyance mechanism including rollers, guides, and the like, software detects the position of the recording member based on an output from a sensor, and controls the positioning of the recording member based on the detection result. In addition, software controls the switching of conveyance paths for the recording member by reversing rollers upon switching the direction of a flapper. It is necessary to change control on the switching timings of the stop position of a recording member and the direction of a flapper, the conveyance velocity of the recording member, and the like in accordance with the size or type of recording member. Control by software is indispensable to perform such complicated control.

With the recent tendency toward higher performance and productivity of image forming apparatuses, software for controlling such image forming apparatus has become more complicated. This increases the number of steps necessary to specify the cause of a problem after it is found in control and also increases the number of steps necessary to correct the software so as to solve the problem and to evaluate the correction result.

An improvement in the performance of a general-purpose computer has increased the chances of using a simulation technique for mechanism design for a conveyance mechanism and the like. For example, Japanese Patent Laid-Open No. 9-81600 has proposed a system for detecting a mechanical defect in a conveyance mechanism by calculating the behavior of a target conveyance member in a conveyance path by simulation.

Japanese Patent Laid-Open No. 5-143260 discloses an arrangement for generating external events, for example, switching on/off printer control software and opening/closing a cover from an input device such as a keyboard.

Although there are simulation systems for evaluation mechanisms, there are still not many design support techniques for inspecting software for controlling mechanisms.

Figure 6:
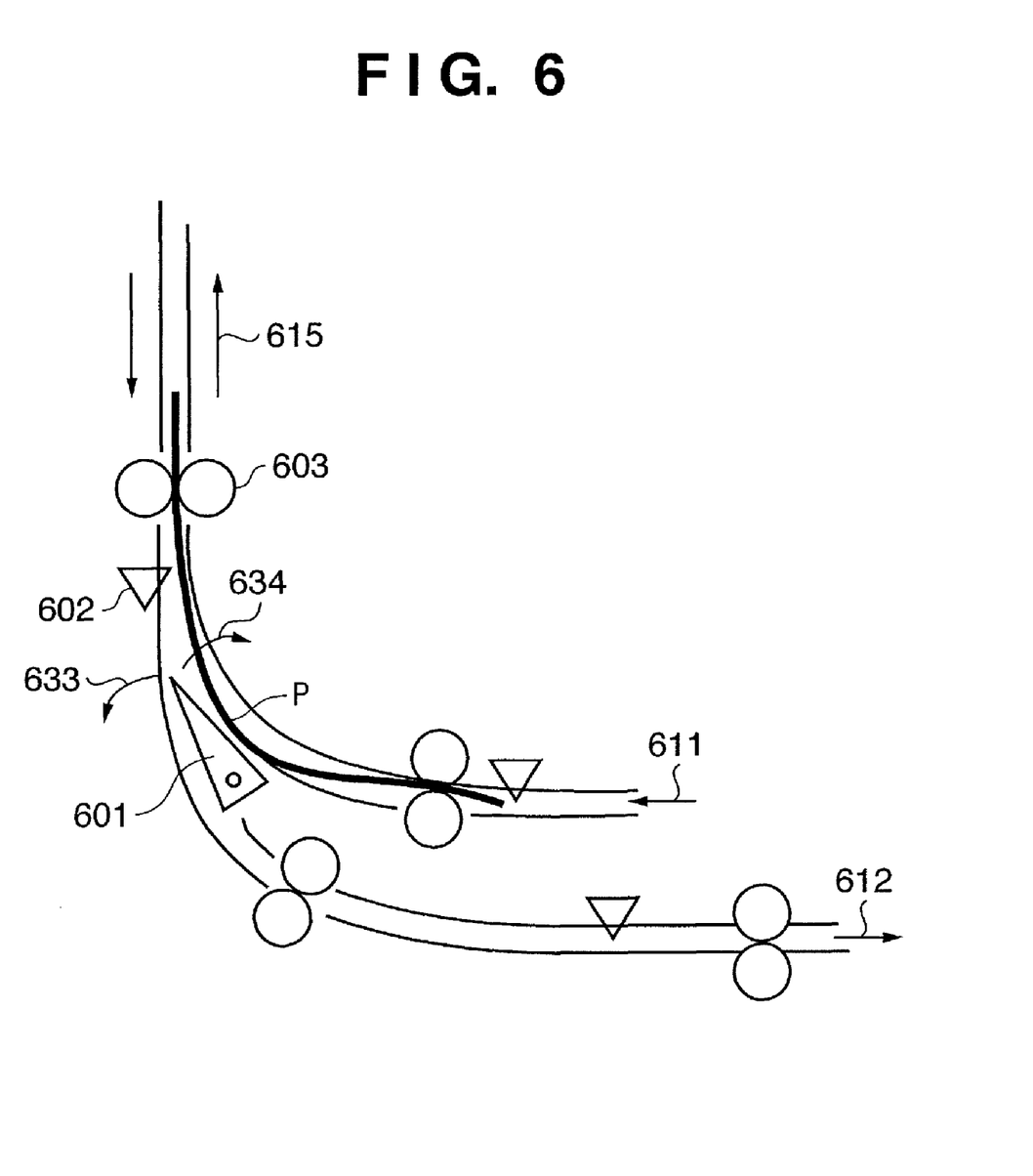
FIG. 6 is a view for explaining conveyance control on a recording member in an image forming apparatus according to the prior art.

FIG. 6 is a view for explaining conveyance control on a recording member in an image forming apparatus according to the prior art. First of all, this apparatus conveys a recording member P conveyed from the direction indicated by an arrow 611 to the direction indicated by an arrow 615 in FIG. 6 by using rollers 603 upon tilting a flapper 601 to the left (in the arrow 633 direction) in FIG. 6. When a sensor 602 detects that the trailing edge of the recording member P has passed through the branch point of the flapper 601, the apparatus temporarily stops the rotation of the rollers 603 and stops the conveyance of the recording member P. The apparatus then switches the direction of the flapper 601 to the right (the arrow 634 direction) in FIG. 6, and reverses the rotating directions of the rollers 603, thereby performing control to feed the recording member P in the direction indicated by an arrow 612. Switching the operations of the rollers 603 and flapper 601 at predetermined timings in this manner will switch the conveyance direction of the recording member P, thereby performing recording member reversing control at the time of double-sided printing.

It should be noted in this case that when, for example, the motor which drives the rollers 603 is a stepping motor, there is a limitation that the motor must be stopped for a predetermined period of time at the time of switching of the rotating direction of the motor in order to prevent step-out.

Alternatively, depending on the switching mechanism for the flapper 601, there is a predetermined time lag between the instant the apparatus controls a clutch and the like for switching the direction of the flapper and the instant the direction of the flapper 601 is reliably switched in fact. In this case, control needs to be performed in consideration of the time lag because the switching operation of the flapper 601 must be complete before the leading edge of the recording member P reaches the flapper 601.

Conventionally, in an operation inspection environment using an actual apparatus, a jam occurs when the motor causes step-out due to a control error by software or the recording member P is fed into a false path due to a switching error on the flapper. In order to continue operation inspection, the user must actually remove the jammed recording member. In this case, the actual apparatus fails, and the operation inspection is forced to be interrupted. In this regard, operation inspection using an actual apparatus is inefficient.

Assume that software has caused a control error. In this case, if this error is not fatal and conveyance control can be performed on a recording member, it is difficult to extract a problem in the software. Even if a software problem has become obvious afterward, it requires many steps to pursue the cause of the problem and correct the software.

The technique disclosed in Japanese Patent Laid-Open No. 9-81600 can specify the cause of a potential problem in hardware, but cannot specify the cause of a potential problem in software which controls the hardware.

Furthermore, the technique disclosed in Japanese Patent Laid-Open No. 5-143260 can find a potential problem in software, but cannot specify the cause of the problem.

SUMMARY OF THE INVENTION

The present invention has been made in consideration of the above problems in the prior art, and has as its object to provide a design support technique which allows efficient inspection of control software for controlling devices.

According to one aspect of the present invention, there is provided a design support method of inspecting control on an image forming apparatus on the basis of a simulation result of operation control on a virtual device which is modeled to simulate operation of the image forming apparatus, the method comprising:

a reference step of referring to control definition information for determining whether an operation request is proper with respect to a virtual device for which the operation request is input, in accordance with an operating state of the virtual device; and a determination step of determining, on the basis of the control definition information referred to in the referring step, whether operation of the virtual device can be performed.

According to another aspect of the present invention, there is provided a design support apparatus for inspecting control on an image forming apparatus on the basis of a simulation result of operation control on a virtual device which is modeled to simulate operation of the image forming apparatus, the apparatus comprising:

a referring unit adapted to refer to control definition information for determining whether an operation request is proper with respect to a virtual device for which the operation request is input, in accordance with an operating state of the virtual device; and a determining unit adapted to determine, on the basis of the control definition information referred to by the referring unit, whether operation of the virtual device can be performed.

According to the present invention, it is possible to efficiently inspect control software for controlling devices.

Further features of the present invention will become apparent from the following description of exemplary embodiments with reference to the attached drawings.

DESCRIPTION OF THE EMBODIMENTS

The preferred embodiments of the present invention will be exemplarily described in detail below with reference to the accompanying drawings. The constituent elements described in these embodiments are merely examples, and the scope of the present invention is not limited to them.

Figure 1:
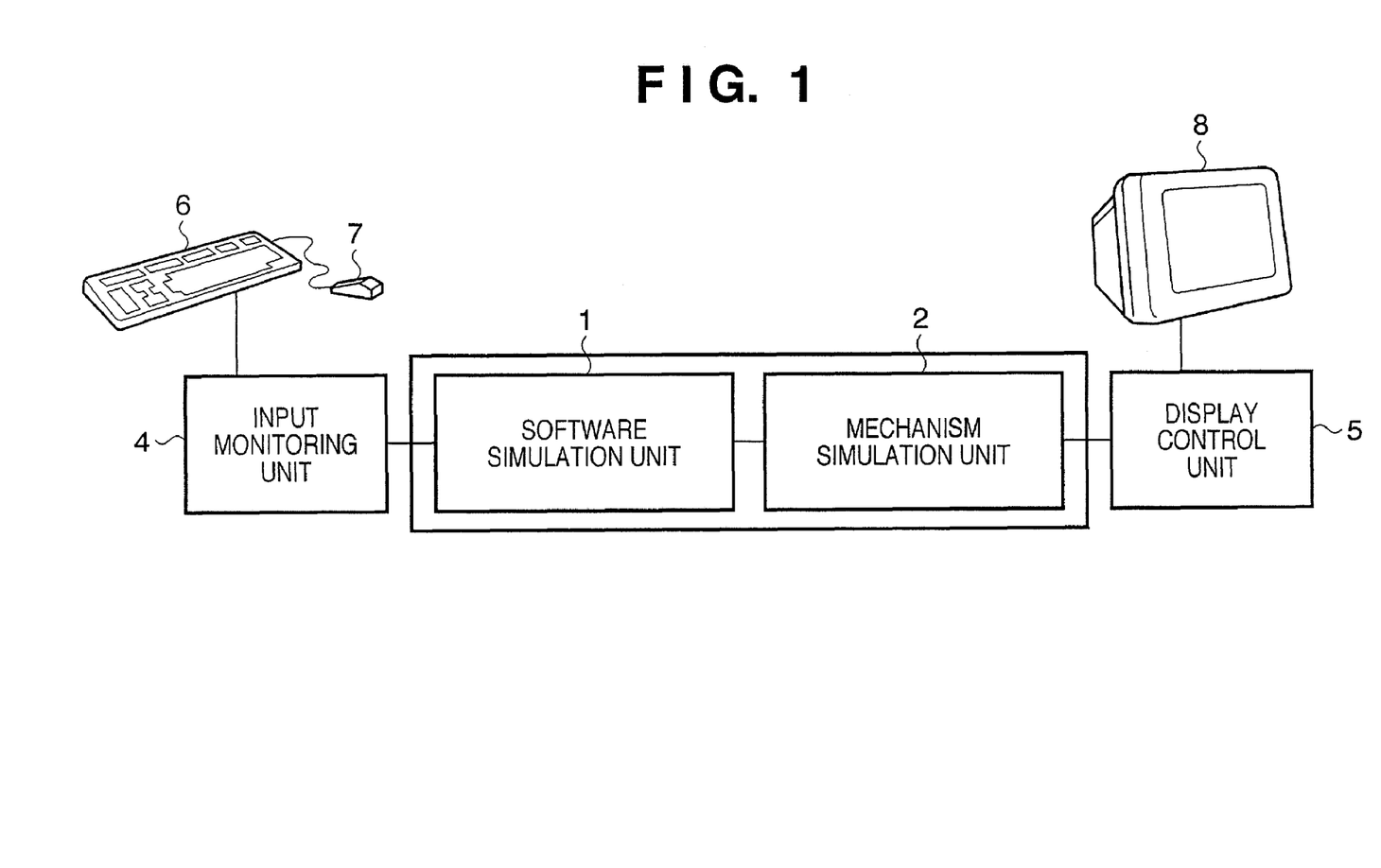
FIG. 1 is a block diagram showing the arrangement of a design support apparatus according to an embodiment of the present invention.

FIG. 1 is a block diagram showing the arrangement of a design support apparatus according to an embodiment of the present invention. The design support apparatus can perform an operation simulation for control software for an image forming apparatus on an information processing apparatus (personal computer) (to be referred to as a "PC" hereinafter). The design support apparatus inspects the control timing of firmware/software (to be referred to as "firmware" hereinafter) for controlling an actual image forming apparatus by simulation.

A software simulation unit 1 causes the firmware for controlling the image forming apparatus to virtually operate on the PC.

An input monitoring unit 4 monitors inputs from a keyboard 6, mouse 7, and the like which constitute a man-machine interface. Upon receiving an execution start request from the input monitoring unit 4, the software simulation unit 1 starts a simulation on the firmware.

A mechanism simulation unit 2 sequentially receives the result obtained by executing the simulation on the firmware by the software simulation unit 1. When, for example, performing a simulation concerning the position of a recording member, the mechanism simulation unit 2 can obtain, by calculation, information indicating in which portion in the recording member conveyance mechanism the recording member exists, from the velocities and the like of rollers associated with recording member conveyance control. In addition, with regard to the position of an image to be formed on a recording member, the mechanism simulation unit 2 can obtain, by calculation, information indicating on which portion of the recording member the image is formed, from the diameters, rotational speeds, and the like of a photosensitive drum and intermediate transfer belt which are associated with image formation. The software simulation unit 1 and a display control unit 5 receive the obtained position information of the image.

A display 8 displays the simulation result under the control of the display control unit 5.

Figure 2:
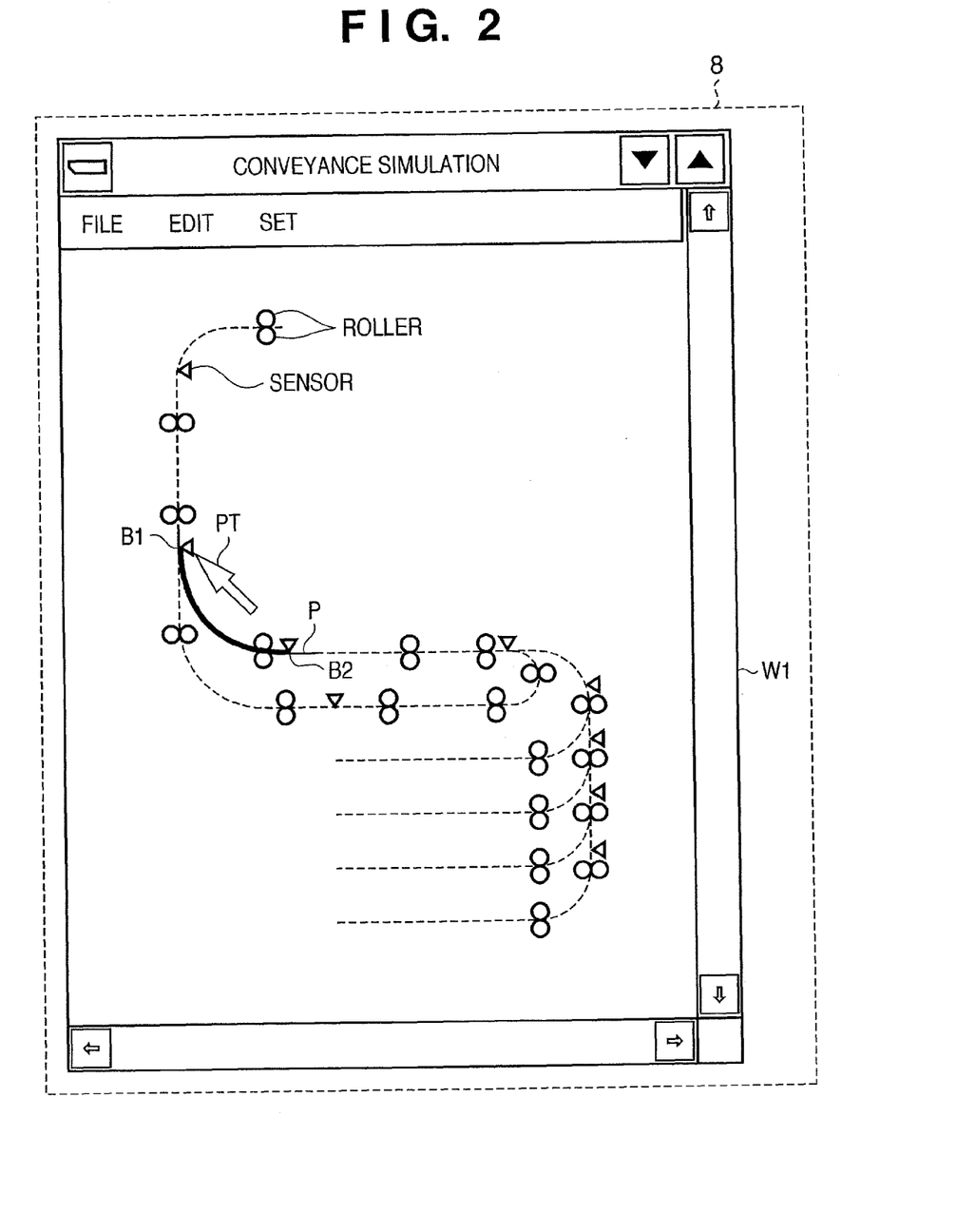
FIG. 2 is an exemplary view showing a recording member conveyance simulation window displayed on a display by a display control unit according to the embodiment of the present invention.

FIG. 2 is a view showing a recording member conveyance simulation window W1 which the display control unit 5 displays on the display 8. The display control unit 5 displays, on the recording member conveyance simulation window W1, how a recording member is conveyed on a recording member conveyance path in a virtual device obtained by modeling an actual image forming apparatus along the lapse of time. The display control unit 5 also displays, on the recording member conveyance simulation window W1, in which area on a recording member an image is formed. Referring to FIG. 2, the dotted lines represent recording member conveyance paths, the circles represent conveyance rollers for recording members, the triangles represent sensors which detect recording members, the solid line represents the recording member P, and the thick solid line represents an image area (B1-B2) of the recording member P on which an image is formed.

Figure 3:
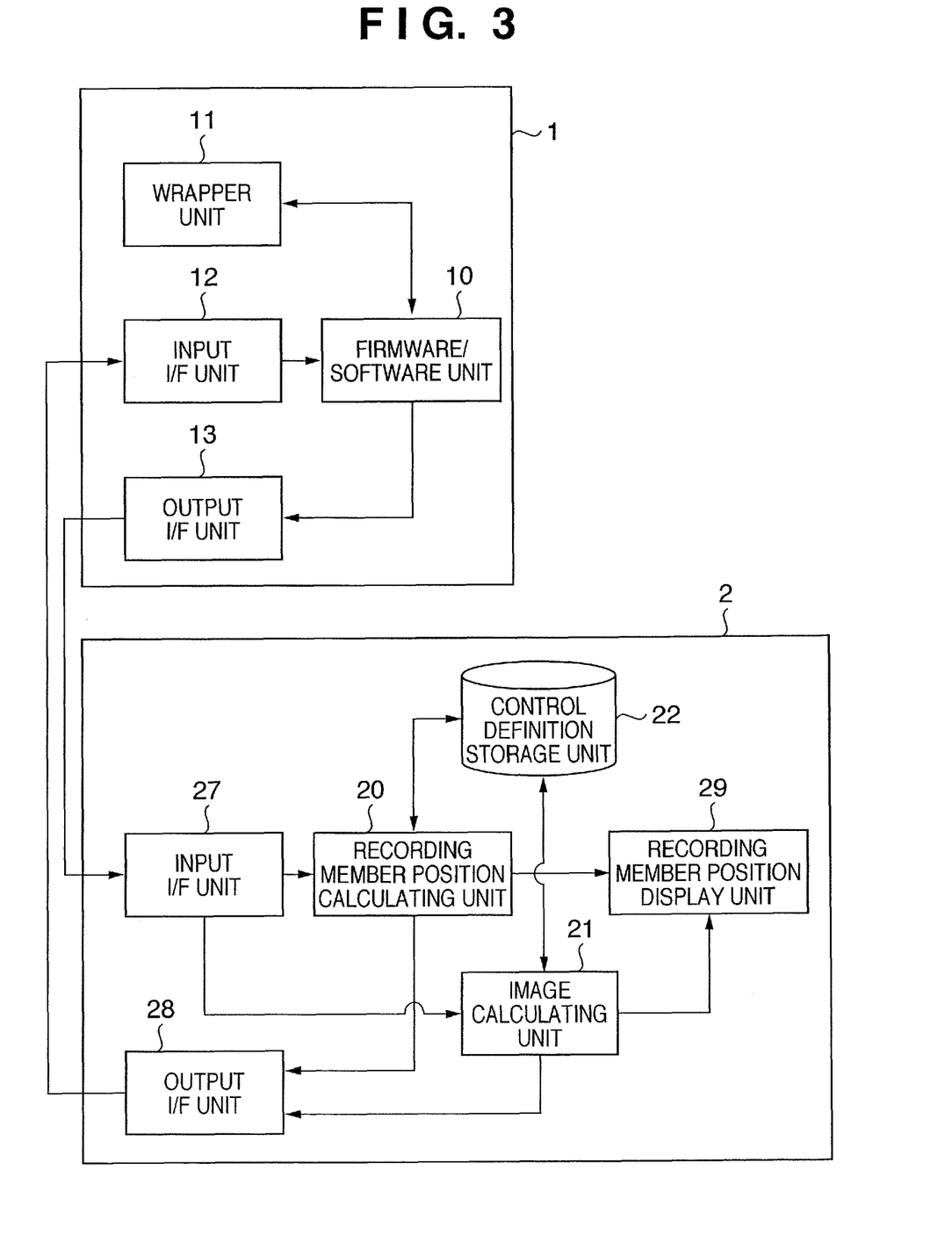
FIG. 3 is a block diagram showing the arrangement of a software simulation unit 1 and mechanism simulation unit 2 constituting the design support apparatus according to the embodiment of the present invention.

FIG. 3 is a block diagram showing the arrangement of the software simulation unit 1 and mechanism simulation unit 2 which constitute the design support apparatus.

The software simulation unit 1 comprises a firmware/software unit 10, wrapper unit 11, input I/F unit 12, and output I/F unit 13.

The firmware/software unit 10 is firmware for controlling the image forming operation of an actual image forming apparatus. The wrapper unit 11 causes the firmware for the actual image forming apparatus to operate on the PC. The input I/F unit 12 inputs information output from the mechanism simulation unit 2 to the firmware/software unit 10. The output I/F unit 13 inputs output information from the firmware/software unit 10 to the mechanism simulation unit 2.

The mechanism simulation unit 2 comprises a recording member position calculating unit 20, image calculating unit 21, control definition storage unit 22, input I/F unit 27, output I/F unit 28, and recording member position display unit 29.

The input I/F unit 27 is a portion which receives an output result from the output I/F unit 13 of the software simulation unit 1. The input I/F unit 27 inputs recording member conveyance control information from the software simulation unit 1 and image formation control information concerning image formation control to the recording member position calculating unit 20 and the image calculating unit 21.

The recording member position calculating unit 20 stores the position information of each virtual device in the simulation. The recording member position calculating unit 20 stores, for example, position information in a recording member conveyance path associated with recording member conveyance devices such as virtual rollers, a virtual flapper, virtual sensors, and the like. The recording member position calculating unit 20 rotates the virtual rollers in accordance with the recording member conveyance control information from the software simulation unit 1. The recording member position calculating unit 20 then calculates and stores the position of a virtual recording member in the recording member conveyance path in accordance with the stored positions and rotational speed of the virtual rollers. The recording member position calculating unit 20 also switches the recording member conveyance path by using the virtual flapper, and determines the output state of the virtual sensor in accordance with the position of the recording member in the simulation.

The image calculating unit 21 stores the position information of each virtual device in the simulation. The image calculating unit 21 stores, for example, the positions of image forming devices such as a virtual photosensitive drum and a virtual intermediate transfer belt in the apparatus. The image calculating unit 21 rotates the virtual photosensitive drum and the virtual intermediate transfer belt in the simulation in accordance with image formation control information from the software simulation unit 1. The image calculating unit 21 calculates and stores virtual image position information from the rotational speeds of the virtual drum and virtual intermediate transfer belt, their positional relationship, parameters for a virtual register, operation timings, and the like.

The control definition storage unit 22 stores control definition information for determining in accordance with the state of the self-device or another device whether operation on a device controlled by the recording member position calculating unit 20 and the image calculating unit 21 is proper when the controlled device is operated. The control definition storage unit 22 stores operation settings for the overall simulation processing. The operation settings for the overall simulation processing include, for example, a setting indicating whether, when an error occurs during simulation operation, the processing is terminated at the occurrence of the error, or is continued while the error information is saved.

An example of the control definition information stored in the control definition storage unit 22 will be described next. In this embodiment, letting the mechanism simulation unit 2 read the control definitions written in a file in advance makes it possible to store the control definition information in the control definition storage unit 22.

EXAMPLE 1

(reverse MOTOR100)(past(stop MOTOR100) 50)

Example 1 shows control definition information in a case wherein in order to perform recording member reversing control when performing double-sided printing, the recording member is stopped in a conveyance path, and the motor performs reversal driving. The recording member position calculating unit 20 can determine from the control definition information based on operation conditions for the motor whether the operation timing of the motor is proper, before the operation of the motor.

"(reverse MOTOR100)" defines the designation of a device as a control target and its operation. In Example 1, the information defines that "motor (MOTOR) 100" is a control target, and the operation is "reversal driving (reverse)".

"(past(stop MOTOR100)50)" defines a condition under which the operation of the control target (motor (MOTOR) 100) is proper. In this case, this information defines that "in order to start reversal driving of the motor 100, it is necessary that the motor 100 has stopped for 50 ms or more".

With regard to the reversal driving start timing of the motor 100, for example, if the motor 100 has been stopped for less than 50 ms in the simulation, the recording member position calculating unit 20 determines that reversal driving cannot be started.

EXAMPLE 2

(up MOTOR200)!(down MOTOR200)

Example 2 shows an example of control definition information for inhibiting, when the motor is a pulse motor, operation of deceleration→acceleration (or acceleration→deceleration) in consideration of the possibility of step-out due to acceleration/deceleration.

"((up MOTOR200))" defines that the control target device is "motor (MOTOR)200", and the operation is "acceleration (up)".

"!(down MOTOR200)" defines a condition under which the operation of the control target (motor (MOTOR)200) is proper. In this case, this information defines that "in order to allow the motor 200 to start acceleration, the motor 200 must not be in a deceleration state".

If the motor starts accelerating from a deceleration state or starts decelerating from an acceleration state, the recording member position calculating unit 20 determines that the operation is not a proper motor driving operation.

EXAMPLE 3

(reverse MOTOR100)(and(past(stop MOTOR100) 50)(past(on FLAPPER150)20))

Example 3 shows control definition information which additionally has "the condition for the flapper" as compared with Example 1, and permits the reversal driving operation of the motor 100.

This information defines that "in order to start reversal driving of the motor 100, it is necessary that the motor has stopped for 50 ms or more, and 50 ms or more have elapsed since a flapper 150 was turned on".

With regard to the reversal driving start timing of the motor 100, for example, if the motor 100 has stopped for less than 50 ms in the simulation, and the flapper 150 has been turned on for less than 20 ms, the recording member position calculating unit 20 determines that reversal driving cannot be started.

EXAMPLE 4

(stop MOTOR200) (and !(down MOTOR200)(past (constant MOTOR200)50))((constant MOTOR200) (past 50)(stop MOTOR200))

Example 4 shows an example of control definition information which defines a combination of a condition for inhibiting operation and processing to be executed when operation is inhibited. For example, defining (definition (follow-up setting) of continuation setting) control on a device mounted outside a CPU such as an ASIC in an actual image forming apparatus in advance makes it possible to control the device under conditions which are not written in firmware.

Example 4 shows a case wherein the control target is the "motor (MOTOR)200" and the operation is "stop".

"(and !(down MOTOR200)(past(constant MOTOR200) (50))" defines that "in order to stop the motor 200, it is necessary that the motor 200 is not in a deceleration state, and the motor 200 has been in a constant-velocity state for 50 ms or more. This information defines conditions for stopping control on the motor.

"((constant MOTOR200) (past 50) (stop MOTOR200))" defines processing to be executed when conditions for stopping control are not satisfied. In this case, this information defines, as a definition (follow-up setting) of continuation setting, the processing of "starting stopping operation control after the lapse of 50 ms since the motor 200 is set in a constant-velocity state".

EXAMPLE 5

(off FLAPPER250)(past(on FLAPPER250)20)

The control definition information in each of Examples 1 to 4 shows a case wherein the control target is a motor. However, according to the gist of the present invention, the control target is not limited to a motor. For example, control definition information can be set for each constituent element of a virtual device as a target for simulation by the recording member position calculating unit 20 and the image calculating unit 21.

Example 5 is an example of control definition information concerning the operation of the control target "flapper (FLAPPER)250", which defines that "in order to turn off the flapper 250, it is necessary that 20 ms or more have elapsed since the flapper 250 was turned on".

If, for example, the flapper 250 is to be turned off at a timing less than 20 ms after the flapper 250 is turned on, the recording member position calculating unit 20 determines that the flapper 250 cannot be turned off.

EXAMPLE 6

(write REG300 1)!(equal REG400 0)

Example 6 shows an example of control definition information concerning a setting for an ASIC register. This is a control definition in a case wherein in order to turn on a device which is turned on by writing "1" in a register REG 300, it is necessary to set a value other than "0" in a register REG 400 in advance.

Although control definition information is written in a file in advance, it suffices to allow the user to set such information by using a GUI (Graphical User Interface) as a means of cooperation between the display control unit 5 and the input monitoring unit 4. In addition, if, for example, it is necessary to set all motors in a hold state for the same period of time at the time of speed change, control definition information can be registered as information common to the devices.

When controlling a given device, the recording member position calculating unit 20 and the image calculating unit 21 controls the device upon determining, by referring to the control definition storage unit 22, whether the device is in an optimal state for control (or operation).

The recording member position display unit 29 instructs the display control unit 5 to display the recording member conveyance simulation window W1 described above based on the position of a recording member which is calculated by the recording member position calculating unit 20 and the position of an image which is calculated by the image calculating unit 21.

The output I/F unit 28 outputs the position information of the recording member which is calculated by the recording member position calculating unit 20. The input I/F unit 12 of the software simulation unit 1 receives the output position information of the recording member.

Figure 4:
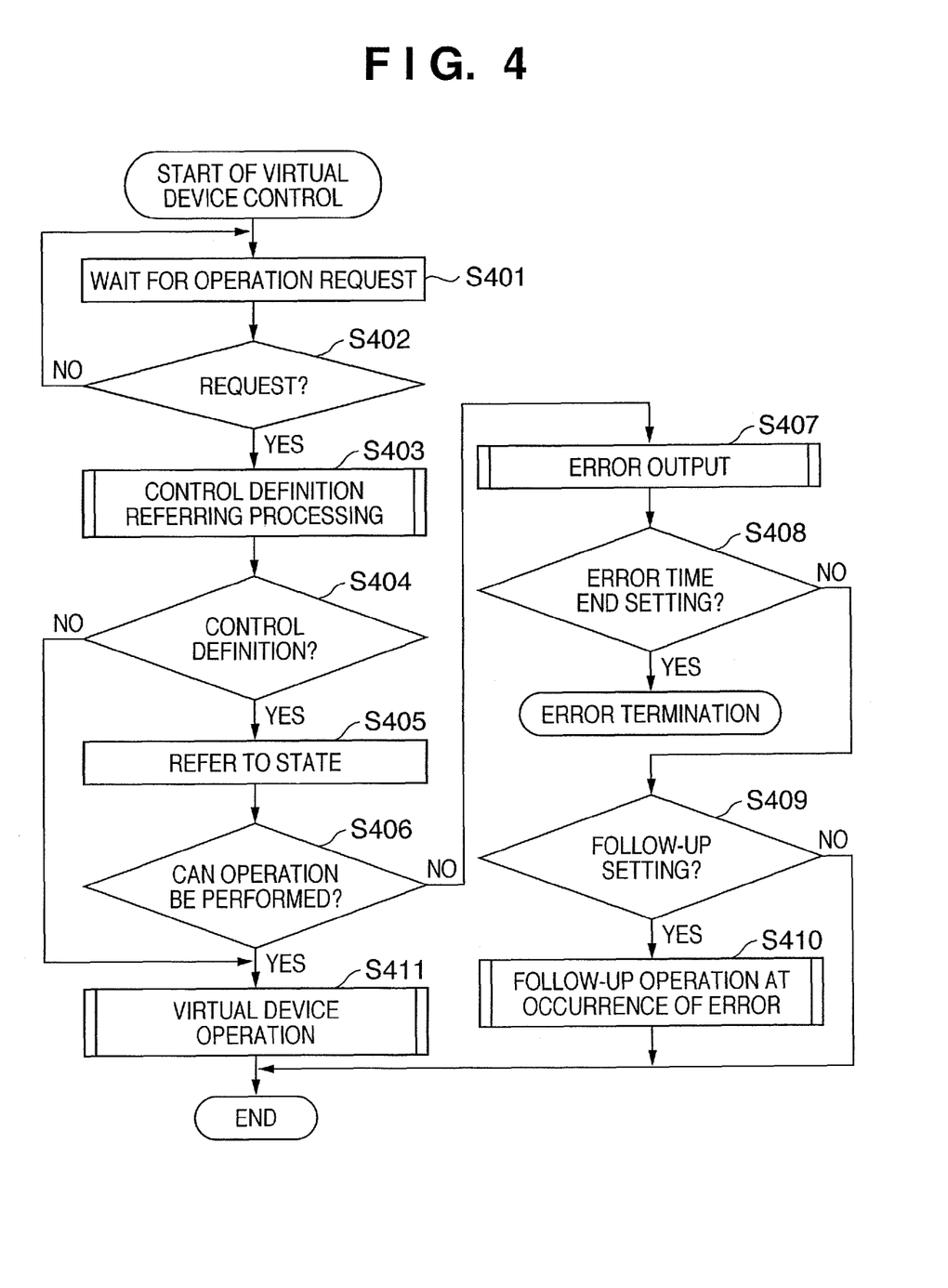
FIG. 4 is a flowchart for explaining a virtual device control procedure executed by a recording member position calculating unit 20 and image calculating unit 21 according to the embodiment of the present invention.

FIG. 4 is a flowchart for explaining a virtual device control procedure executed by the recording member position calculating unit 20 and image calculating unit 21.

First of all, the recording member position calculating unit 20 or image calculating unit 21 waits for the input of a device operation request from the firmware/software unit 10 to each virtual device (S401 and S402).

Upon receiving a device operation request (YES in step S402), the recording member position calculating unit 20 or the image calculating unit 21 acquires control definition information for the corresponding device by referring to the control definition storage unit 22 (S403).

If it is determined in step S404 that there is no corresponding control definition information (NO in step S404), the process advances to step S411, in which the recording member position calculating unit 20 or the image calculating unit 21 performs the requested device operation and terminates the processing.

If it is determined in step S404 that there is corresponding control definition information (YES in step S404), the process advances to step S405, in which the recording member position calculating unit 20 or the image calculating unit 21 refers to the condition defined by the control definition information.

In step S406, the recording member position calculating unit 20 or the image calculating unit 21 determines whether the virtual device calculated by simulation can perform the operation requested by the firmware/software unit 10.

For example, according to the control definition in Example 1, if the comparison between the stop time of the motor 100 in the simulation and the current time indicates that the motor 100 has stopped for 50 ms or more, the recording member position calculating unit 20 determines that it is possible to perform reversal driving operation of the motor 100.

If it is determined in step S406 that it is possible to perform the operation (YES in step S406), the process advances to step S411, in which the recording member position calculating unit 20 or the image calculating unit 21 performs the requested device operation and terminates the processing.

If it is determined in step S406 that the operation condition defined by the control definition information is not satisfied and the operation cannot be performed (NO in step S406), the recording member position calculating unit 20 or the image calculating unit 21 outputs, in step S407, error information indicating that a device operation error has occurred. The recording member position calculating unit 20 or the image calculating unit 21 can output the error information to the display control unit 5 through the output I/F unit 28. Upon receiving the error information, the display control unit 5 displays it on the display 8. The recording member position calculating unit 20 or image calculating unit 21 can also output the information as log information including the occurrence state of the error.

In step S408, the recording member position calculating unit 20 or the image calculating unit 21 refers to the preset operation setting at the occurrence of a simulation error. Upon determining by referring to the control definition information that the operation setting at the occurrence of an error is the setting for termination (YES in step S408), the recording member position calculating unit 20 or the image calculating unit 21 terminates the processing.

If it is determined in step S408 that the operation setting is not the setting for termination (NO in step S408), the process advances to step S409. In step S409, the recording member position calculating unit 20 or the image calculating unit 21 determines whether the control definition information includes a definition (follow-up setting) for a continuation setting. If there is no definition (follow-up setting) for a continuation setting (NO in step S409), the recording member position calculating unit 20 or the image calculating unit 21 terminates the device operation.

Upon determining in step S409 that a definition (follow-up setting) is set for a continuation setting (YES in step S409), the recording member position calculating unit 20 or the image calculating unit 21 performs operation based on the defined follow-up setting in step S410 and terminates the processing.

Figure 5A:
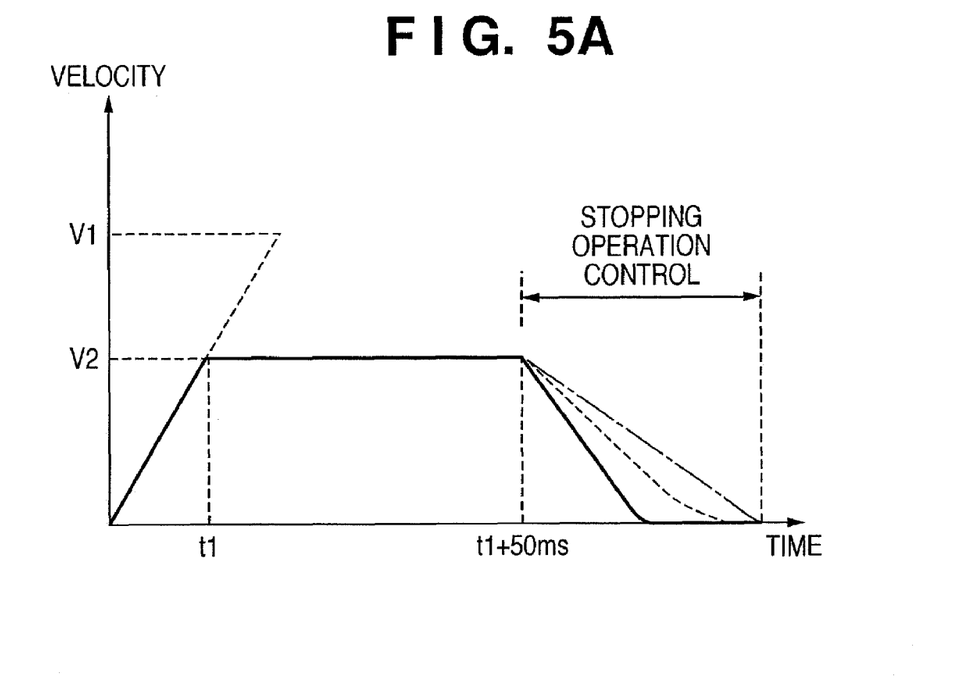
FIGS. 5A and 5B are graphs each showing a concrete example of follow-up setting operation.
Figure 5B:
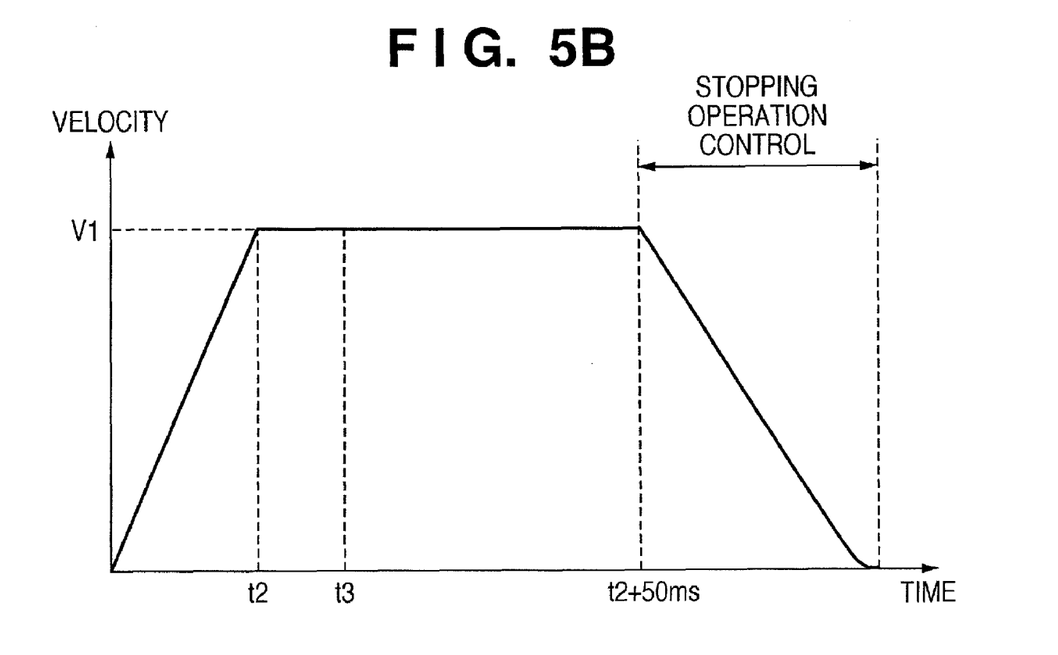

FIGS. 5A and 5B each show a concrete example of a follow-up setting. This example is an example of the operation of the motor 200 based on the control definition in Example 4 described above.

Assume that in FIG. 5A, the motor 200 is accelerating to a target velocity V1. If a stop request is input at the timing (time t1) of an acceleration V2 during acceleration, since the motor 200 is set a constant-velocity state at this point of time and 50 ms has not elapsed, the motor 200 is switched to constant-velocity control at the velocity V2. After the motor is set in the constant-velocity state and 50 ms have elapsed (t1+50 ms), the stopping operation control on the motor 200 starts.

Assume that in FIG. 5B, the motor 200 has reached the target velocity V1 (time t2), and a stop request is input at a timing (time t3) at which the motor is operating in the constant-velocity state. In this case, since the motor 200 is set in the constant-velocity state and 50 ms has not elapsed at time t3, the stopping operation control on the motor 200 starts after 50 ms elapses (t2+50 ms) from time t2 when the motor is set in the constant-velocity state.

For the stopping operation control shown in FIGS. 5A and 5B, it is possible to define a deceleration, stop time, and settling time. It is possible to change a profile from the constant-velocity state to the stopping of the motor 200 in accordance with a combination of a deceleration, stop time, and settling time.

Although this embodiment has exemplified control on the recording member conveyance mechanism of the printer unit of the image forming apparatus, it is obvious that the gist of the present invention is not limited to this example. It is possible to apply the present invention to control on devices constituting the image forming apparatus, for example, recording member conveyance control on the reader unit of the image forming apparatus or control on image read processing in the same manner as described above. In addition, it is possible to apply the gist of the present invention to a device irrelevant to the conveyance of a recording member. It is possible to apply the embodiment of the present invention to control on a single device or a plurality of devices which operate in cooperation with each other.

As has been described above, according to the embodiment of the present invention, it is possible to efficiently inspect control software for controlling devices.

Other Embodiments

Obviously, the object of the present invention is implemented even by supplying a storage medium storing software program codes for implementing the functions of the above embodiment to a system or apparatus, or by causing the computer (or a CPU or an MPU) of the system or apparatus to read out and execute the program codes stored in the storage medium.

In this case, the program codes read out from the storage medium implement the functions of the above embodiment by themselves, and the storage medium storing the program codes constitutes the present invention.

As a storage medium for supplying the program codes, a flexible disk, hard disk, optical disk, magnetooptical disk, CD-ROM, CD-R, nonvolatile memory card, ROM, or the like can be used.

The computer implements the functions of the above embodiment by executing the readout program codes. Obviously, the present invention incorporates a case wherein the above embodiment is implemented when the OS (Operating System) running on the computer performs part or all of actual processing based on the instructions of the program codes.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-244826, filed Sep. 8, 2006, which is hereby incorporated by reference herein in its entirety.

What is claimed is

1. A design support method of inspecting control on an image forming apparatus on the basis of a simulation result of operation control on a virtual device which is modeled to simulate operation of the image forming apparatus, the method comprising:
a reference step of referring to control definition information for determining whether a timing of an operation request is proper with respect to a virtual device for which the operation request is input, in accordance with a current operating state of the virtual device;
a determination step of determining, on the basis of the control definition information referred to in the referring step, whether operation of the virtual device can be performed; and
an error output step of outputting an error on a display unit when it is determined that the operation of the virtual device cannot be performed in the determination step.

2. The method according to claim 1, further comprising:
a computation step of executing computation for simulating operation control on the virtual device when it is determined in the determination step, on the basis of the control definition information, that the operation of the virtual device can be performed; and
a display control step of displaying a computation result in the computation step on the display unit.

3. The method according to claim 2, further comprising a continuation setting determination step of, when it is determined in the determination step on the basis of the control definition information that the operation of the virtual device cannot be performed, determining whether the control definition information includes a continuation setting for continuing operation,
wherein if it is determined in the continuation setting determination step that the control definition information includes the continuation setting for continuing the operation, in the computation step, computation for simulating operation control on the virtual device is executed in accordance with the continuation setting.

4. A design support apparatus for inspecting control on an image forming apparatus on the basis of a simulation result of operation control on a virtual device which is modeled to simulate operation of the image forming apparatus, the apparatus comprising:
a referring unit adapted to refer to control definition information for determining whether a timing of an operation request is proper with respect to a virtual device for which the operation request is input, in accordance with a current operating state of the virtual device;

a determining unit adapted to determine, on the basis of the control definition information referred to by said referring unit, whether operation of the virtual device can be performed; and an error output unit adapted to output an error on a display when said determining unit determines that the operation of the virtual device cannot be performed.

5. A computer-readable storage medium storing a design support program which causes a computer to execute a design support method, said design support method comprising:

a reference step of referring to control definition information for determining whether a timing of an operation request is proper with respect to a virtual device for which the operation request is input, in accordance with a current operating state of the virtual device;

a determination step of determining, on the basis of the control definition information referred to in the referring step, whether operation of the virtual device can be performed; and an error output step of outputting an error on a display unit when it is determined that the operation of the virtual device cannot be performed in the determination step.

* * * * *